(12) United States Patent
Matsuura

(10) Patent No.: US 7,459,361 B2
(45) Date of Patent: Dec. 2, 2008

(54) SEMICONDUCTOR DEVICE WITH FERROELECTRIC CAPACITOR AND FABRICATION METHOD THEREOF

(75) Inventor: Katsuyoshi Matsuura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/358,398

(22) Filed: Feb. 22, 2006

(65) Prior Publication Data

US 2007/0120165 A1 May 31, 2007

(30) Foreign Application Priority Data

Nov. 30, 2005 (JP) ............................. 2005-346066

(51) Int. Cl.
*H01L 21/8242* (2006.01)

(52) U.S. Cl. ............................ 438/239; 438/3; 438/396; 438/387; 257/E21.664

(58) Field of Classification Search ................ 438/396, 438/3; 257/E21.664
See application file for complete search history.

(56) References Cited

U.S. PATENT DOCUMENTS

| | | | | |
|---|---|---|---|---|
| 6,372,598 B2 * | 4/2002 | Kang et al. | ................... | 438/399 |
| 6,495,412 B1 | 12/2002 | Zhu et al. | | |
| 6,613,585 B2 * | 9/2003 | Sakurai et al. | ................... | 438/3 |
| 6,638,775 B1 * | 10/2003 | Kweon | ........................... | 438/3 |
| 6,730,951 B2 | 5/2004 | Nagano et al. | | |
| 6,956,279 B2 * | 10/2005 | Song | .......................... | 257/533 |
| 2003/0001280 A1 * | 1/2003 | Noguchi et al. | ............. | 257/774 |
| 2003/0124842 A1 * | 7/2003 | Hytros et al. | ............... | 438/680 |
| 2004/0166596 A1 | 8/2004 | Sashida et al. | | |
| 2005/0012133 A1 * | 1/2005 | Mikawa et al. | .............. | 257/310 |
| 2005/0059236 A1 * | 3/2005 | Nishida et al. | .............. | 438/655 |
| 2005/0087788 A1 * | 4/2005 | Kutsunai et al. | ............ | 257/306 |
| 2006/0027847 A1 * | 2/2006 | Koo et al. | .................... | 257/295 |
| 2006/0175643 A1 * | 8/2006 | Nomura et al. | ............. | 257/295 |

FOREIGN PATENT DOCUMENTS

| | | | |
|---|---|---|---|
| JP | 11031791 A | * | 2/1999 |
| JP | 2000-91511 | | 3/2000 |
| JP | 2003-86771 | | 3/2003 |
| JP | 2004-153031 | | 5/2004 |

* cited by examiner

*Primary Examiner*—Marcos D. Pizarro
*Assistant Examiner*—Igwe U. Anya
(74) *Attorney, Agent, or Firm*—Westerman, Hattori, Daniels & Adrian, LLP.

(57) ABSTRACT

A semiconductor device fabrication method includes the steps of forming a conductive plug in an insulating layer on a semiconductor substrate so as to be connected to an element on the substrate; forming a titanium aluminum nitride (TiAlN) oxygen barrier film over the conductive plug; forming a titanium (Ti) film over the oxygen barrier film; applying a thermal process to the titanium film in nitrogen atmosphere to allow the titanium film to turn into a titanium nitride (TiN) film; and forming a lower electrode film of a capacitor over the titanium nitride film.

8 Claims, 14 Drawing Sheets

FIG.3A
FIG.3B
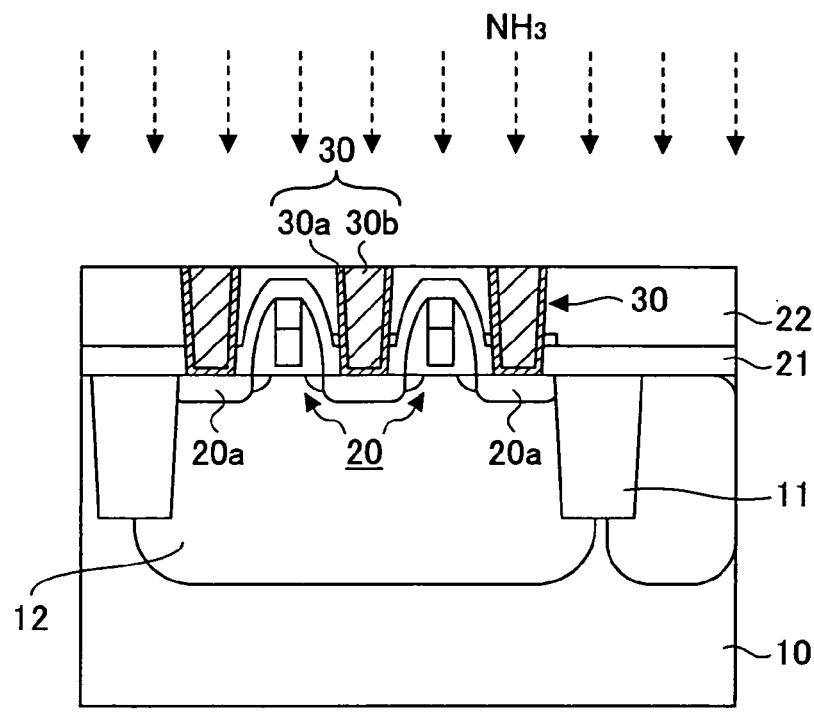
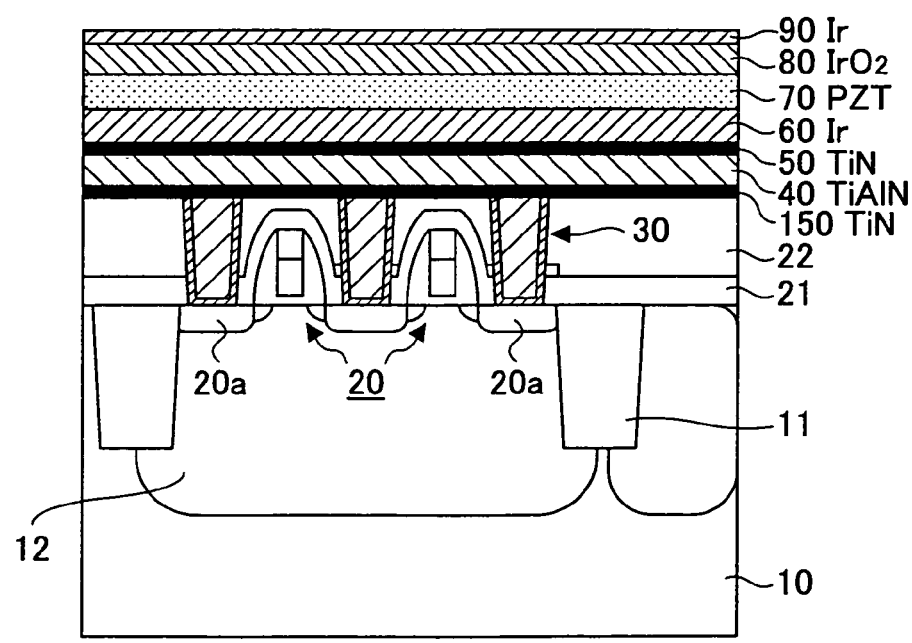

SEMICONDUCTOR DEVICE WITH FERROELECTRIC CAPACITOR AND FABRICATION METHOD THEREOF

CROSS-REFERENCE TO RELATED APPLICATIONS

This application is based upon and claims priority of Japanese Patent Application No. 2005-346066, filed in Nov. 30, 2005, the contents being incorporated herein by reference.

BACKGROUND OF THE INVENTION

1. Field of the Invention

The present invention relates to a semiconductor device with a ferroelectric capacitor and a fabrication method thereof.

2. Description of the Related Art

Flash memory and ferroelectric RAM (FeRAM) are each known as a nonvolatile memory that does not loose its data even if the system or the device is turned off. In other words, it is unnecessary for nonvolatile memories to have their memory contents periodically refreshed.

Flash memory has a floating gate embedded in the gate insulating film of an insulated gate field effect transistor (IGFET). To store information, an electric charge representing the information is accumulated in the floating gate. It is necessary to supply a tunneling current in order to write or erase the information, and a relatively high voltage has to be applied.

FeRAM stores information making use of the hysteresis characteristic of a ferroelectric material. A ferroelectric capacitor has a ferroelectric film inserted between a pair of electrodes. Upon application of an electric voltage between the electrodes, polarization occurs. Even after removing the applied electric voltage, spontaneous polarization is maintained. When inverting the polarity of the applied voltage, the spontaneous polarization is also inverted. By detecting the spontaneous polarization, information can be read from the memory. FeRAM can operate at a lower voltage, and is capable of high-speed writing operations, while saving electric power, as compared with flash memories.

FIG. 1A and FIG. 1B are circuit diagrams of an FeRAM memory cell. FIG. 1A illustrates a 2T/2C FeRAM using two transistors (Ta and Tb) and two capacitors (Ca and Cb) to store 1-bit information. One of the capacitors (e.g., Ca) stores "1" or "0", and the other capacitor (e.g., Cb) stores the inverted information to carry out complimentary operations. This configuration is durable against process fluctuation, but requires double the cell area, as compared with 1T/1C FeRAM.

FIG. 1B illustrates a 1T/1C FeRAM using a transistor (T1 or T2) and a capacitor (C1 or C2) to store 1-bit information. This configuration is the same as a DRAM structure, and suitable for high-density integration because of a smaller cell area. However, a reference voltage is required to determine whether the electric charge read from the memory cell represents "1" or "0". Because the reference cell for generating the reference voltage has to invert the polarization every time information is read from the memory cell, it is degraded much earlier than the memory cell due to fatigue. In addition, the determination margin of the 1T/1C cell is narrower than that of a 2T/2C cell, and it is weak in process fluctuation.

The ferroelectric film used in a FeRAM is made of a PZT based material, such as lead-zirconium-titanium oxide (PZT) or La-doped PZT (PLZT), or a bismuth (Bi) layered compound, such as $SrBi_2Ta_2O_9$ (SBT, Y1) or $SrBi_2(Ta, Nb)_2O_9$ (SBTN, YZ). Ferroelectric materials easily suffer from hydrogen reduction. In order to maintain the FeRAM quality, recovery annealing is performed on the ferroelectric film at 500° C. to 700° C. in the oxidizing atmosphere because the subsequent process after formation of the ferroelectric capacitor includes hydrogen generating steps including growth of interlevel dielectric films.

The next-generation FeRAM, such as 0.18 µm FeRAM, will obviously employ the 1T/1C structure, and is supposed to employ a stacked capacitor structure (for directing connecting the ferroelectric capacitor to the transistor using a plug electrode) for the purpose of further increasing the degree of integration.

Plug electrodes are typically formed of tungsten (W) because tungsten is a low-resistance and heat-stable material, as compared with doped silicon. However, when oxidized, tungsten forms a high-resistance oxide. Only partial oxidation of the tungsten plug causes the plug resistance to greatly increase, which makes it difficult to ensure electric contact and prevents the FeRAM from correctly functioning as a memory device.

Meanwhile, because of the recovery annealing performed in the oxidizing atmosphere, a noble metal, such as platinum (Pt) or iridium (Ir), or a material that can maintain electric conductivity even under the oxidizing environment, such as $IrO_2$, $SrRuO_3$, or $La_{0.5}Sr_{0.5}CoO_3$, is used to form the lower electrode of the ferroelectric capacitor. However, the lower electrode made of the above-described material cannot prevent oxygen diffusion at or near 600° C. This means that the recovery annealing performed at a high temperature (at or above 600° C.) causes the tungsten plug to be oxidized through the lower electrode.

SUMMARY OF THE INVENTION

The present invention is conceived in view of the above-described problems in the prior art, and it is an object of the invention to provide a highly reliable semiconductor device with a stacked ferroelectric capacitor having improved crystal qualities of the lower electrode film (such as an iridium film) and the ferroelectric film, while preventing undesirable oxidation.

In one aspect of the invention, a semiconductor device with a ferroelectric capacitor arranged over a conductive plug is provided. In this semiconductor device, the lower electrode of the ferroelectric capacitor includes:

(a) a titanium aluminum nitride (TiAlN) film provided over the conductive plug;
(b) a titanium nitride (TiN) film formed over the titanium aluminum nitride film, the titanium nitride film being a nitride product obtained by a thermal process applied to a titanium (Ti) film arranged over the titanium aluminum nitride film; and
(c) a lower electrode film arranged over the titanium nitride (TiN) film.

By inserting the TiN film over the TiAlN film that serves as an oxidation barrier film, good crystal quality of the thin films located on or above the TiN film can be maintained, while preventing the electric resistance from increasing due to oxidation of titanium.

In another aspect of the invention, a semiconductor device with a ferroelectric capacitor has a lower electrode that includes:

(a) a titanium aluminum nitride (TiAlN) film positioned over a conductive plug for connecting the ferroelectric capacitor to an element on a semiconductor substrate; and (b) an iridium (Ir) film containing titanium particles and positioned over the titanium aluminum nitride film.

In still another aspect of the invention, a method for fabricating a semiconductor device with a ferroelectric capacitor is provided. The method includes the steps of:
(a) forming a conductive plug in an insulating layer on a semiconductor substrate so as to be connected to an element on the substrate;
(b) forming a titanium aluminum nitride (TiAlN) oxygen barrier film over the conductive plug;
(c) forming a titanium (Ti) film over the oxygen barrier film;
(d) applying a thermal process to the titanium film in a nitrogen atmosphere to allow the titanium film to turn into a titanium nitride (TiN) film; and
(e) forming a lower electrode film of a capacitor over the titanium nitride film.

In yet another aspect of the invention, a method for fabricating a semiconductor device with a ferroelectric capacitor includes the steps of:
(a) forming a conductive plug in an insulating film so as to be connected to an element on a semiconductor substrate;
(b) forming a titanium aluminum nitride (TiAlN) oxygen barrier film over the conductive plug;
(c) forming a titanium (Ti) film over the oxygen barrier film;
(d) forming an iridium (Ir) film over the titanium film; and
(e) causing titanium particles of the titanium film to diffuse into the iridium film and the titanium aluminum nitride film until the titanium film is eliminated so as to form a lower electrode of a capacitor using the iridium film containing diffused titanium particles and the titanium aluminum nitride film.

With either method, good crystal quality of the titanium can be reflected in the crystal orientation of the upper layers. Because the titanium film is not exposed in the oxygen atmosphere, oxidization of titanium is prevented, and electric resistance of the device can be maintained low.

Consequently, the crystal quality of the ferroelectric film to be formed on the lower electrode is improved, while oxidization of the conductive plug and the titanium film (serving as the crystal quality improving film) is prevented. Electric contact between the ferroelectric capacitor and the element on the substrate can be achieved without causing electric resistance to increase, and switching capacitance Qsw can be maintained high.

BRIEF DESCRIPTION OF THE DRAWINGS

Other objects, features, and advantages of the present invention will become more apparent from the following detailed description when read in conjunction with the accompanying drawings, in which:

FIG. 3A through FIG. 3D illustrate a semiconductor device fabrication process according to the second embodiment of the invention;

DETAILED DESCRIPTION OF THE PREFERRED EMBODIMENTS

Figure 1A:
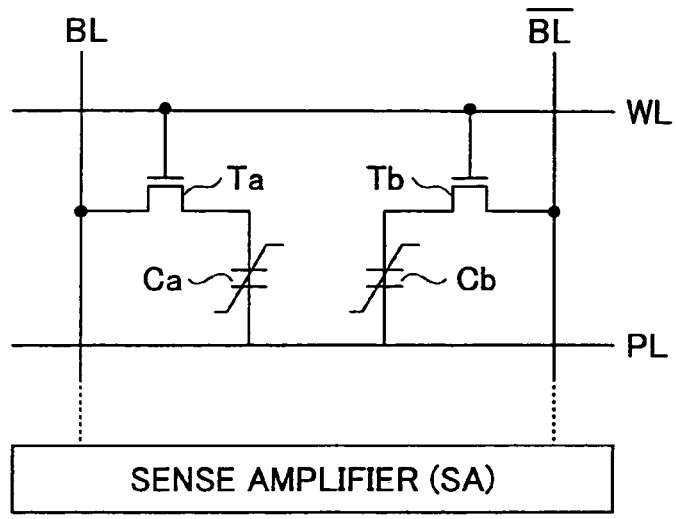
FIG. 1A and FIG. 1B illustrate memory cell circuits of a 2T/2C FeRAM and a 1T/1C FeRAM, respectively.
Figure 1B:
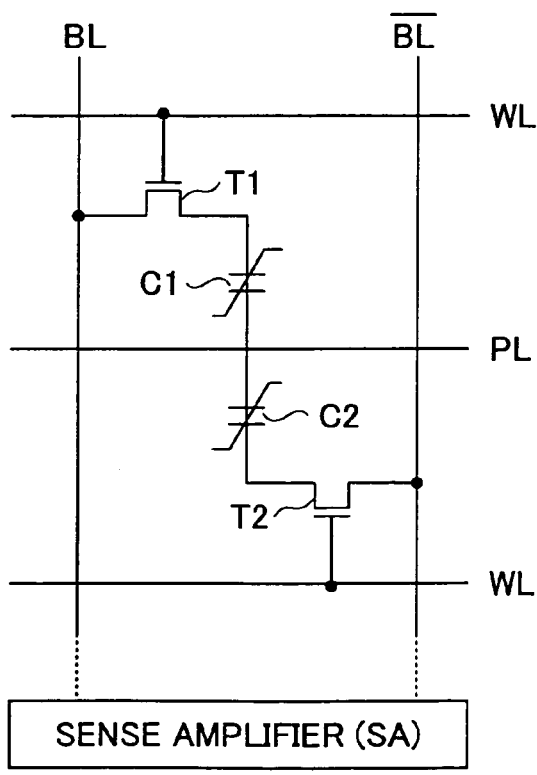

Prior to describing the preferred embodiments, development of the present invention is explained.

To prevent so-called interface oxidation causing tungsten of the plug electrode (or contact plug) to be oxidized through the lower electrode during recovery annealing at high temperature, an oxygen barrier film may be inserted between the lower electrode and the plug electrode. If titanium aluminum nitride (TiAlN) is used for the oxygen barrier film, a capacitor can be fabricated using a high dielectric constant material without oxidizing the plug electrode because the oxidation rate of TiAlN is less than that of TiN by two orders of magnitude or more. Although aluminum nitride (AlN) is an insulator, impurity-added AlN is a conductor. Impurities can be added to AlN by causing a nitrogen (N) lacking state or adding a cationic impurity, such as titanium (Ti) ions.

By the way, the ferroelectric film is formed generally by sputtering; however, a sol-gel method or an MOCVD method is also used to form the ferroelectric film. When a ferroelectric film, such as a PZT film, is formed by a sputtering method, the lower electrode positioned under the ferroelectric film is formed of platinum (Pt). This is because the underlying lower electrode has to be a (111) oriented film in order to increase the spontaneous polarization of the PZT crystal, and because platinum (Pt) is strongly (111) oriented and suitable for the lower electrode.

With a sputtering method, if a PZT film is grown at a high temperature, the crystal quality is degraded. For this reason, an amorphous film is formed at a low temperature, and then rapid thermal annealing (RTA) is performed in an oxygen atmosphere to crystallize the film. Since RTA crystallization requires a high temperature at or above 700° C., the tungsten (W) plug is likely to be oxidized even if an oxygen barrier film (such as a TiAlN film) is used.

In contrast, metal organic chemical vapor deposition (MOCVD) techniques allow a PZT film to maintain good crystal quality during growth on the lower electrode, and do not require crystallization annealing. Accordingly, the process temperature can be reduced. However, if the PZT film is formed by MOCVD on a platinum (Pt) lower electrode, the lead (Pb) contained in the PZT film reacts with platinum to produce $PtPb_x$, which reaction product damages the interface between the lower electrode and the PZT film and degrades the film qualities. Accordingly, when the PZT film is formed by MOCVD, platinum (Pt) cannot be used as the lower electrode material.

To overcome this problem, it is proposed to use a material other than platinum (Pt) for the lower electrode when employing an MOCVD method to form a ferroelectric film. Such a material includes a noble metal except for Pt, and a conductive noble metal oxide. Among these materials, oxide conductors, such as iridium oxide ($IrO_x$), are unsuitable for the lower electrode because the oxide conductors are subjected to reduction during the MOCVD process for forming the PZT film.

For this reason, a noble metal nonreactive with PZT (e.g., iridium) is used as the lower electrode material. In addition, inserting the TiAlN oxygen barrier film between the Ir electrode and the W plug is advantageous from the viewpoint of oxidation resistance because the electric contact property of the tungsten (W) plug can be maintained even if recovery annealing is performed at or above 700° C.

To improve the characteristics of the ferroelectric film, JP 2004-153031A proposes to perform plasma irradiation of NH3 gas on the dielectric layer in which the contact plug is formed, to form a thin film using a material with strong self-orientation, such as titanium or aluminum, after the plasma irradiation, and to form a lower electrode and a ferroelectric film over the self-oriented thin film. By performing plasma irradiation, the crystal orientation of the self-oriented thin film is further improved, and the crystal quality of the conductive film or the ferroelectric film to be formed over the thin film can also be improved.

However, through thorough research, the inventor of the present invention found that the crystal quality of the iridium (Ir) film formed over the titanium aluminum nitride (TiAlN) film is unsatisfactory. This is because the crystal quality of the TiAlN film itself is not so good, and because the unsatisfactory crystal quality of the TiAlN film causes the crystal quality of the iridium (Ir) film to be also degraded. The crystal degradation of the lower electrode further degrades the crystal quality of the ferroelectric film, and as a result, satisfactory FeRAM functions cannot be brought out.

Then, it may be proposed to form a titanium (Ti) seed film with strong self orientation over the titanium aluminum nitride (TiAlN) film prior to forming an iridium (Ir) film in order to improve the crystal quality of the ferroelectric film. Since the crystal quality of the iridium film is improved by the underlying titanium film, the crystal quality of the ferroelectric film formed over the iridium film is also improved.

However, this proposal causes another problem during the actual semiconductor device fabrication process. When an easily oxidized titanium film is provided to the oxygen barrier site located over the plug electrode, the titanium film itself is oxidized and electric resistance becomes high.

In view of the newly arising problem, the inventor finally reached a novel structure and fabrication method of a FeRAM with a stacked capacitor, in which crystal qualities of the ferroelectric capacitor are maintained high and simultaneously, oxidation of a titanium film used as a seed film for improving the crystal quality of upper layers is efficiently prevented even if titanium aluminum nitride (TiAlN) with poor crystal orientation is used for the oxygen barrier film.

The actual embodiments are described below in conjunction with the attached figures.

First Embodiment

FIG. 2A through FIG. 2I illustrate in cross-sectional views a semiconductor device fabrication process according to the first embodiment of the invention. In the first embodiment, a titanium (Ti) film is formed as a seed film for improving the crystal quality of upper layers over the titanium aluminum nitride (TiAlN) film provided directly on the contact plug for connecting the ferroelectric capacitor to the transistor on the substrate. The Ti film is annealed in the nitrogen atmosphere to form a titanium nitride (TiN) film, and an iridium (Ir) film is formed as a lower electrode film over the TiN film.

Figure 2A:
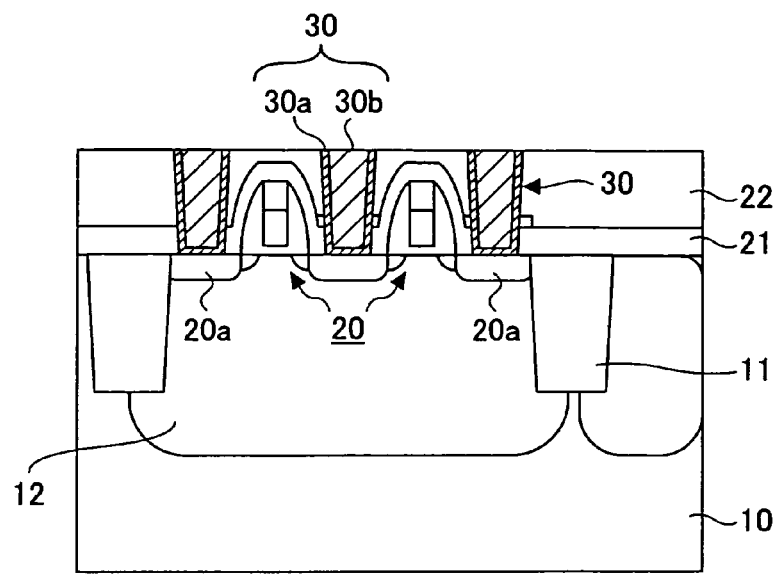
FIG. 2A through FIG. 2I illustrate a semiconductor device fabrication process according to the first embodiment of the invention.

To be more precise, as illustrated in FIG. 2A, MOS transistors 20 are fabricated using a known technique in a well region 12 defined by active region isolation (e.g., STI region) 11 in a semiconductor substrate 10. The MOS transistors 20 are covered with a cover insulating film (e.g., SiON film) 21, and a first interlevel dielectric film 22 is deposited. Contact plugs 30 reaching the impurity diffusion regions 20a of the MOS transistors 20 are formed in the first interlevel dielectric film 22. The contact plug 30 is formed by, for example, sputtering a TiN (50 nm)/Ti (30 nm) glue film 30a in a contact hole (not shown) formed in the first interlevel dielectric film 22, depositing a tungsten (W) film 30b by CVD, and flattening the surface by CMP.

Figure 2B:
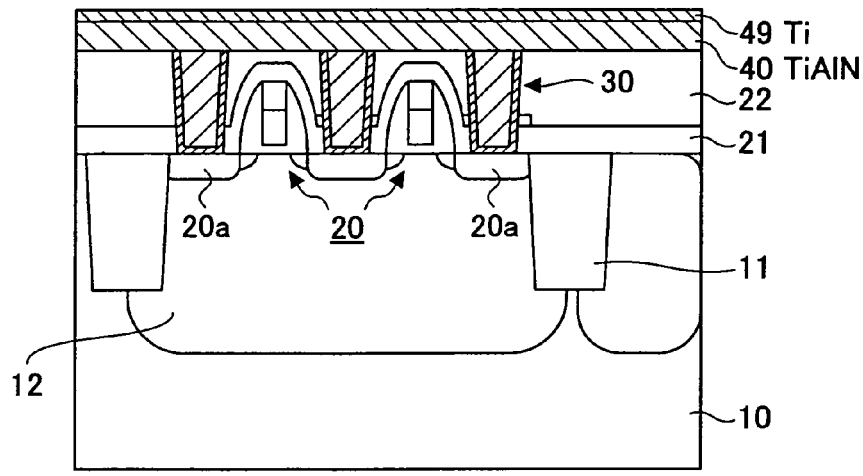

Then, as illustrated in FIG. 2B, a titanium aluminum nitride (TiAlN) film 40 with a thickness of 100 nm and a titanium film 49 with a thickness of 20 nm are deposited successively in this order. The TiAlN film 40 serves as an oxygen barrier film, and Ti film 50 serves as a seed film for improving the crystal quality of upper layer. These films are to be a part of a lower electrode of a ferroelectric capacitor.

Figure 2C:
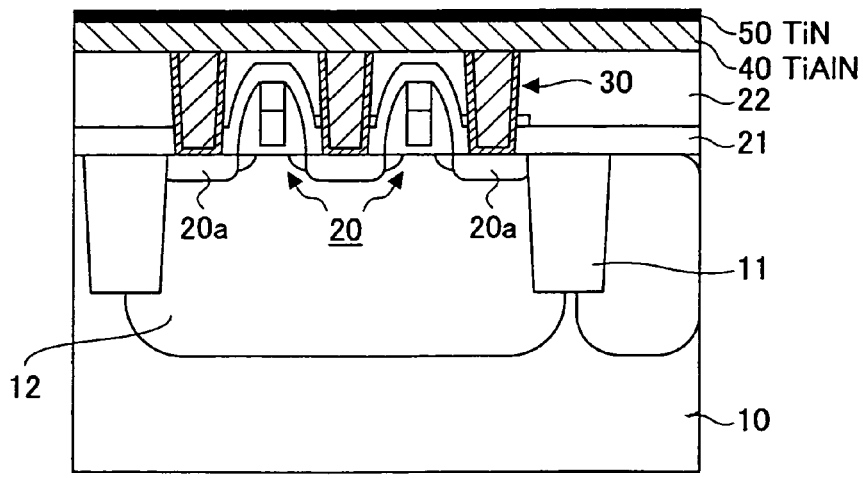

Then, as illustrated in FIG. 2C, rapid thermal annealing (RTA) is performed on the entire wafer at 650° C. for 90 seconds under nitrogen (N2) supply at 10 l/min (liters per minute). By this thermal process, the Ti seed film 49 turns into a titanium nitride (TiN) film 50.

Figure 2D:
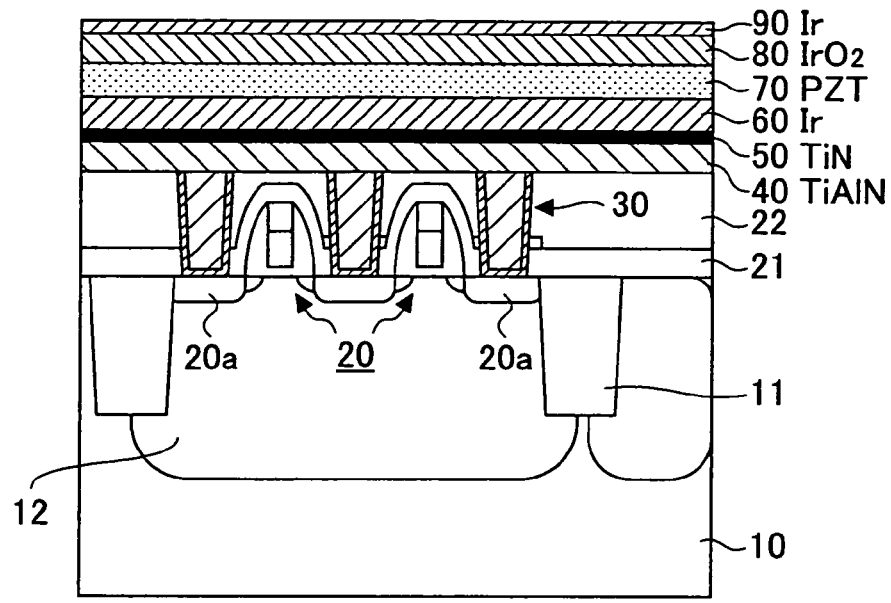

Then, as illustrated in FIG. 2D, an iridium (Ir) film 60 with a thickness of 100 nm is formed as a lower electrode film over the TiN film 50 by sputtering at 500° C. Then, a first PZT film (not shown) with a thickness of 5 nm is formed over the Ir film 60 by an MOCVD method, and successively a second PZT film (not shown) with a thickness of 115 nm is formed by a MOCVD method. These PZT films define a ferroelectric film 70. During the MOCVD process, the wafer temperature and the pressure are set to 620° C. and 5 Torr, respectively. The compositions of the first and second PZT films are the same; however, the partial pressure of oxygen during the film formation is different. In deposition of the first PZT film, the partial pressure of oxygen is lower than that for the second PZT film because the crystal quality of the PZT Film is more improved at a lower partial pressure of oxygen. However, if the entire PZT film is formed at a lower partial pressure of the oxygen gas, oxygen deficiency in the PZT film becomes conspicuous, which causes leakage current to increase. Accordingly, two-step film formation is employed in the embodiment to form the PZT ferroelectric film 70 with satisfactory film quality.

IrO$_2$ film 80 with a thickness of 150 nm, which serves as an upper electrode film, is formed over the PZT film 70 by sputtering, and then Ir film 90 with a thickness of 50 nm is formed.

Figure 2E:
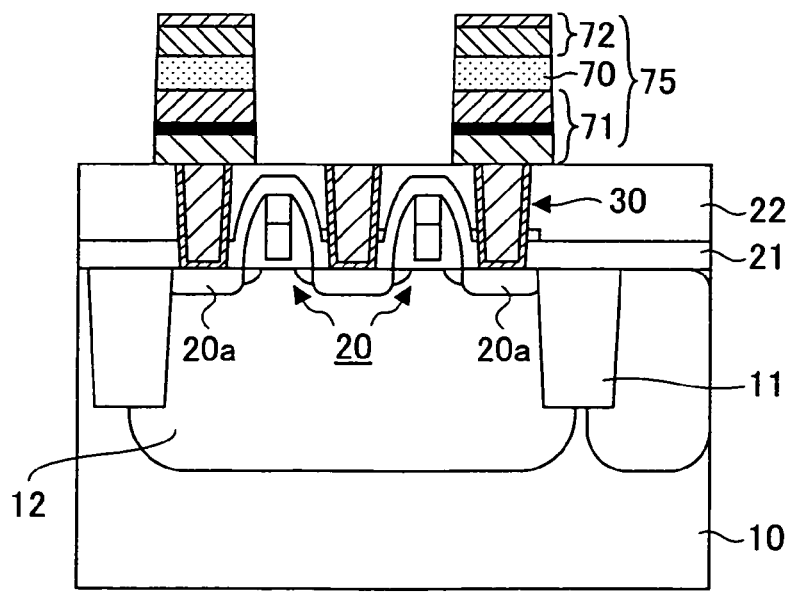

Then, as illustrated in FIG. 2E, the above-described films 40, 50, 60, 70, 80, and 90 are patterned into a stacked ferroelectric capacitor 75 consisting of an upper electrode 72, a ferroelectric film 70, and a lower electrode 71 using known patterning and etching techniques. For the ferroelectric film 70 to recover from the damage suffered during the film formation of the upper electrode 72, recovery annealing is performed in the annealing furnace at 550° C. for 60 minutes in an oxygen (O$_2$) atmosphere. In this annealing, the side face of the capacitor 75 is exposed to the oxygen atmosphere. However, the easily oxidized titanium (ti) film is nitrided in advance, and incorporated as the TiN film 50 in the layered structure. Consequently, electric resistance of the device can be prevented from rising.

Figure 2F:
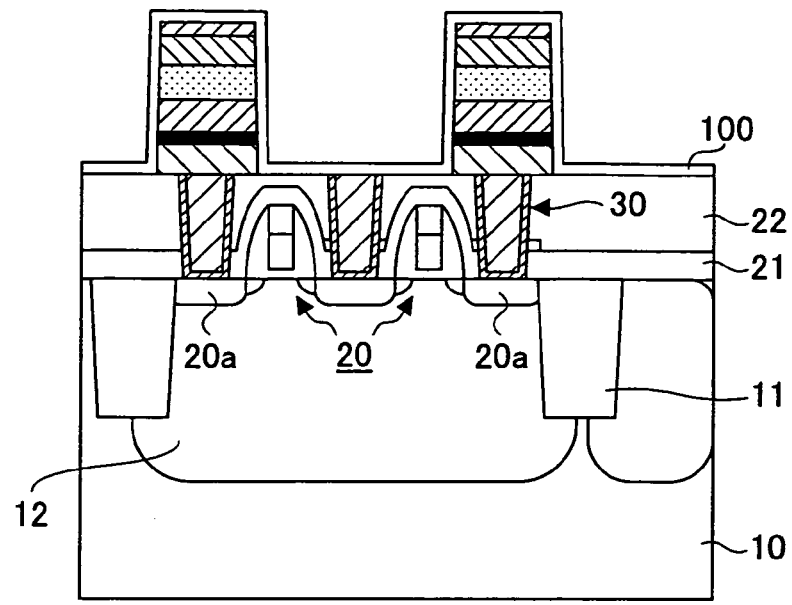

Then, as illustrated in FIG. 2F, the ferroelectric capacitor 75 and the first interlevel dielectric film 22 are covered with a protection film 100 with a thickness of 20 nm by an atomic layer deposition (ALD) method. In this example, the protection film 100 is an aluminum oxide film with excellent step coverage.

Figure 2G:
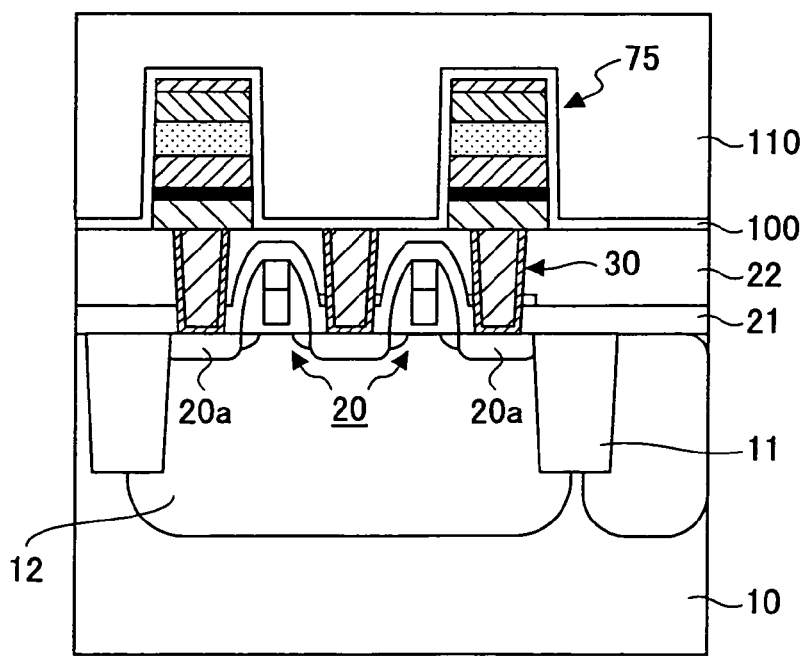

Then, as illustrated in FIG. 2G, the second interlevel dielectric film 110 is deposited over the entire surface, and flattened by CMP. In this example, the second interlevel dielectric film 110 is an oxide film formed by a high density plasma (HDP) CVD apparatus. The net thickness of the second interlevel dielectric film 110 after CMP is 300 nm above the upper electrode 72 of the ferroelectric capacitor 75.

Figure 2H:
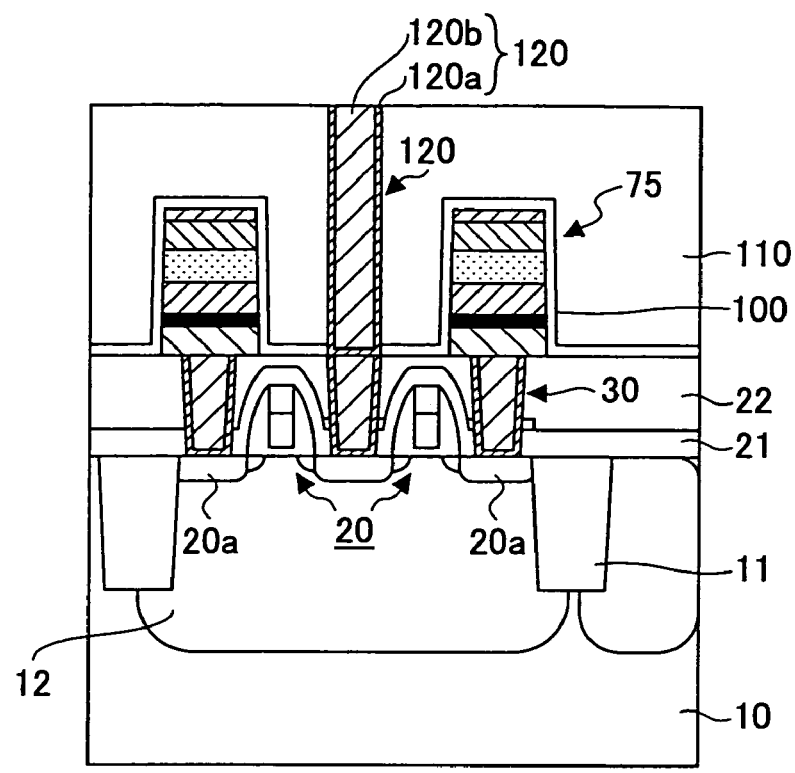

Then, as illustrated in FIG. 2H, a tungsten (W) plug 120 connected to the underlayer W plug 30 is formed in the second interlevel dielectric film 110. To be more precise, a contact hole (not shown) reaching the W plug 30 is formed in the second interlevel dielectric film 110, a glue film 120a and a tungsten film 120b are formed in the contact hole and over the second interlevel dielectric film 110, and CMP is performed. The glue film 120a is, for example, a titanium nitride (TiN) film with a thickness of 50 nm. The W plug 120 and the underlayer W plug 30 provide via-to-via contact, and electric contact from an upper-layer metal interconnection (which will be described below) to the substrate 10 is achieved.

Figure 2I:
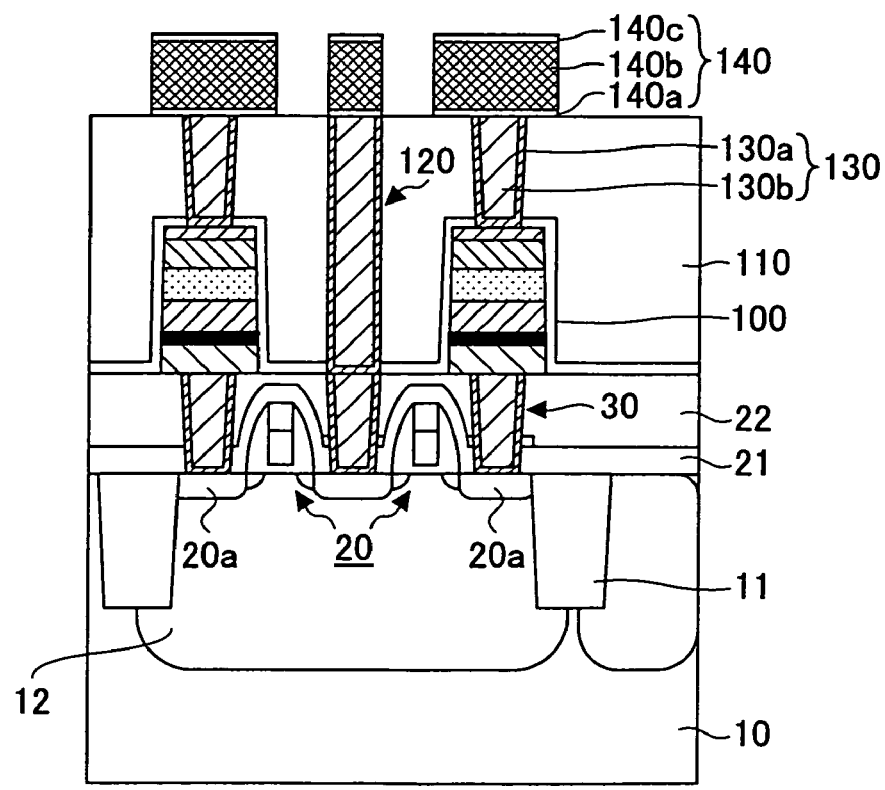

Then, as illustrated in FIG. 2I, a tungsten (W) plug connected to the upper electrode 72 of the ferroelectric capacitor 75 is formed. To be more precise, an antioxidizing protection film (not shown) with thickness of 100 nm is formed of SiON to protect the exposed surface of tungsten (W) plug 120, and a contact hole (not shown) reaching the upper electrode Ir layer 90 of the ferroelectric capacitor 75 is formed in the second interlevel dielectric film 110. Then, recovery annealing ($O_2$ furnace annealing) is performed at 500° C. for 60 minutes, and the SiON antioxidizing protection film is etched back. A TiN glue film 130a and tungsten (W) film 130b are deposited in the contact hole and over the entire surface of the second interlevel dielectric film 110, and the glue film 130a and the tungsten film 130b deposited over the second interlevel dielectric film 110 surface are removed by CMP to define the tungsten plug 130.

In addition, a first metal interconnection 140 is formed over the second interlevel dielectric film 110. In this example, a TiN (70 nm) film 140a, an Al—Cu (360 nm) film 140b, and a Tin (50 nm) film 140c are successively deposited, and patterned into a prescribed shape to form the metal interconnection 140. Although not shown in the figure, the second and subsequent metal interconnections and contact plugs for connecting metal connections at different layers may be formed, and finally, a SiN cover film is formed to protect the semiconductor device.

In this semiconductor device with the ferroelectric capacitor 75, the titanium (Ti) seed film 50 capable of improving the crystal orientation of the upper layers is arranged on the TiAlN film 40 that serves as the oxygen barrier layer in the lower electrode 71, and the Ti film 50 is nitrided before the patterning and recovery annealing for the ferroelectric capacitor. Accordingly, the crystal orientations of upper films are improved without causing the electric resistance to increase.

Second Embodiment

The second embodiment of the invention is described in conjunction with FIG. 3A through FIG. 3D. In the second embodiment, plasma processing using an NH3 gas is applied to the interlevel dielectric layer 22 in which the contact plug 30 is formed, and another titanium seed film (second Ti seed film) is formed over the plasma processed surface of the interlevel dielectric layer 22 prior to the formation of the TiAlN film 40. The second Ti seed film is nitrided to form a second TiN film. The TiAlN oxygen barrier film 40 is to be sandwiched between the second TiN film and the originally provided TiN film 50.

To be more precise, as illustrated in FIG. 3A, MOS transistors 20 are formed on the semiconductor substrate 10 and a tungsten (W) plug 30 connected to one of the MOS transistors 20 is formed in the interlevel dielectric layer 22. After the planarization, plasma irradiation is performed using NH3 gas to treat and modify the surface quality of the interlevel dielectric layer 22. Because the ratio of the tungsten plug area to the capacitor area is less than 20%, surface modification of the interlevel dielectric layer 22 leads to improvement of the crystal quality of the ferroelectric film 70, and as a result, the switching capacitance Qsw increases as a whole.

The NH3 plasma irradiation is performed for 3 minutes under the conditions that the amount of NH3 gas flow supplied into the plasma generating chamber is 250 sccm, with a chamber pressure of 4 Torr, a wafer temperature of 400° C., and RF power of 400 W.

As to the surface modification mechanism of the interlevel dielectric layer 22, it is observed by Fourier transform infrared spectrometry (FT-IR) that when NH3 plasma irradiation is applied to the silicon oxide (SiO2) dielectric layer 22, O—H bonding decreases while N—H bonding increases. Without NH3 plasma irradiation, the oxygen atoms appear on the SiO2 surface, and titanium (Ti) atoms are easily bound to the oxygen (O) atoms. This O—Ti binding prevents titanium migration, and the c-axis of the Ti crystal is offset from the perpendicular direction. As a result, the crystal quality of the Ti film is degraded.

In contrast, under the application of NH3 plasma irradiation, the oxygen (O) atoms existing on the surface area are bound to nitrogen (N) atoms, and the other binding hand of the nitrogen atom is terminated by a hydrogen (H) atom. This means that the reactivity of the SiO2 surface with respect to titanium (Ti) is reduced, and that titanium (Ti) migration is promoted. As a result, the c-axis of the titanium crystal orients perpendicular to the substrate.

Then, as illustrated in FIG. 3B, a titanium (Ti) film (not shown) with a thickness of 20 nm is formed over the surface-modified (or NH3 plasma processed) interlevel dielectric layer 22. This Ti film is nitrided through rapid thermal annealing (RTA) at 650° C. in a nitrogen (N2) atmosphere to obtain a titanium nitride (TiN) film 150. The crystal quality of the TiN film 150 is as good as that of the Ti film.

On the TiN film 150 are formed a titanium aluminum nitride (TiAlN) film 40 with a thickness of 100 nm and a titanium seed film 49 (not shown) with a thickness of 20 nm. RTA is performed in the nitrogen atmosphere to obtain a titanium nitride (TiN) film 50. This RTA process is performed for 90 seconds at 650° C. under nitrogen (N2) supply of 10 l/min. Then, an iridium (Ir) film 60 with a thickness of 100 nm is formed as a lower electrode film over the TiN film 50 by sputtering at 500° C. As in the first embodiment, a two-layered PZT ferroelectric film 70 is formed over the Ir film 60 by an MOCVD method, and $IrO_2$ film 80 with a thickness of 150 nm, which serves as an upper electrode film, and Ir film 90 with a thickness of 50 nm are successively formed over the PZT film 70.

Figure 3C:
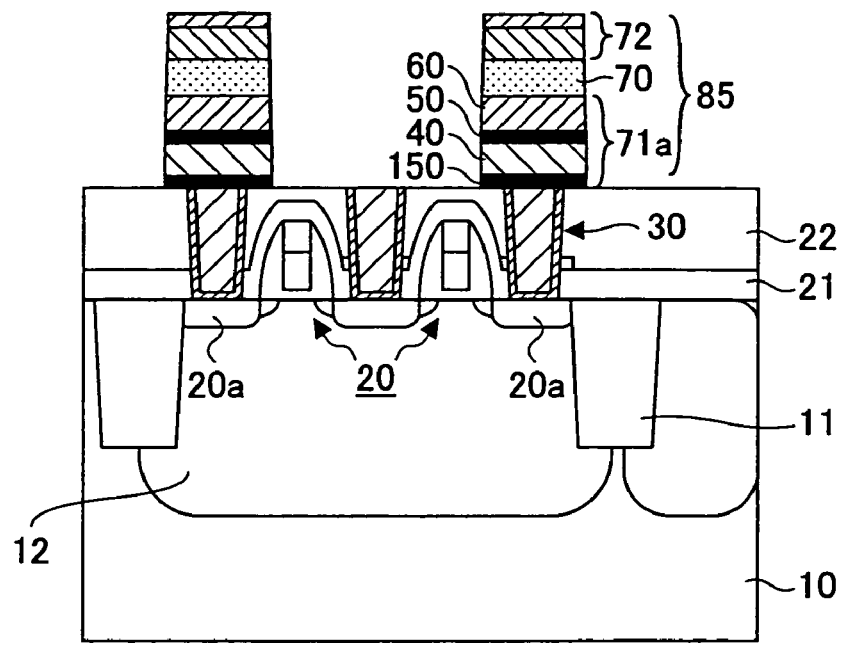

Then, as illustrated in FIG. 3C, the above-described films 150, 40, 50, 60, 70, 80, and 90 are patterned into a stacked ferroelectric capacitor 85 consisting of an upper electrode 72, a ferroelectric film 70, and a lower electrode 71a using known patterning and etching techniques. For the ferroelectric film 70 to recover from the damage suffered during the film formation of the upper electrode 72, recovery annealing is performed. Although, in this annealing, the side face of the capacitor 85 is exposed to the oxygen atmosphere, electric resistance of the device can be maintained low because the titanium (ti) film is nitrided in advance and oxidation of titanium does not occurs.

Figure 3D:
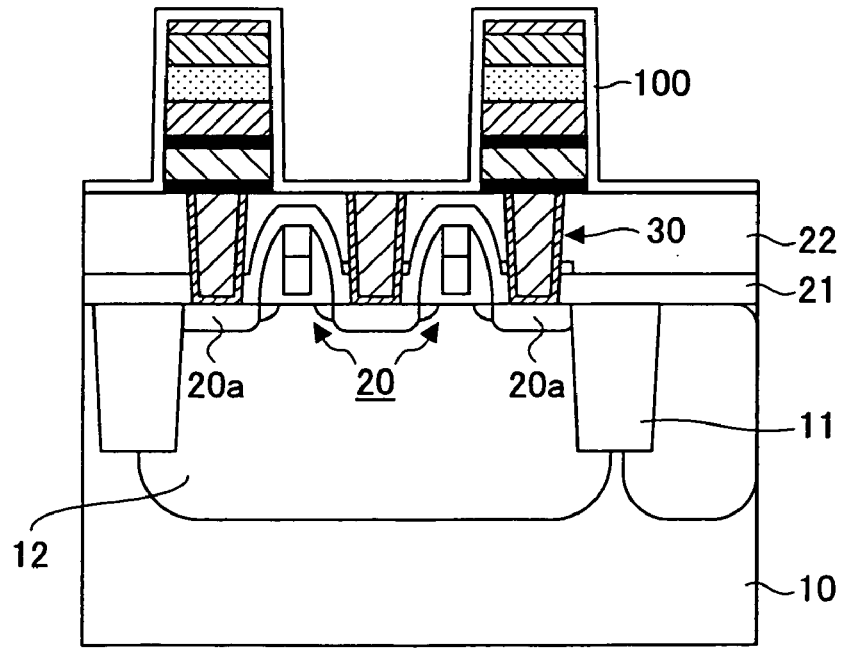

Then, as illustrated in FIG. 3D, the ferroelectric capacitor 85 and the first interlevel dielectric film 22 are covered with a protection film 100 with a thickness of 20 nm by an atomic layer deposition (ALD) method. In this example, the protection film 100 is an aluminum oxide film with excellent step coverage. Since the subsequent steps are the same as those shown in FIG. 2G through FIG. 2I, explanation for them is omitted.

The arrangement of the second embodiment can further improve the crystal quality of the TiAlN oxygen barrier film 40, and increase of electric resistance due to oxidation of titanium can be prevented.

Third Embodiment

FIG. 4A through FIG. 4G illustrate in cross-sectional views a semiconductor device fabrication process according to the third embodiment of the invention. In the third embodiment, an iridium (Ir) film is formed on a titanium (Ti) film placed over the TiAlN film, and annealing is performed to diffuse the titanium particles into the Ir film and the TiAlN film until the Ti seed film is eliminated.

Figure 4A:
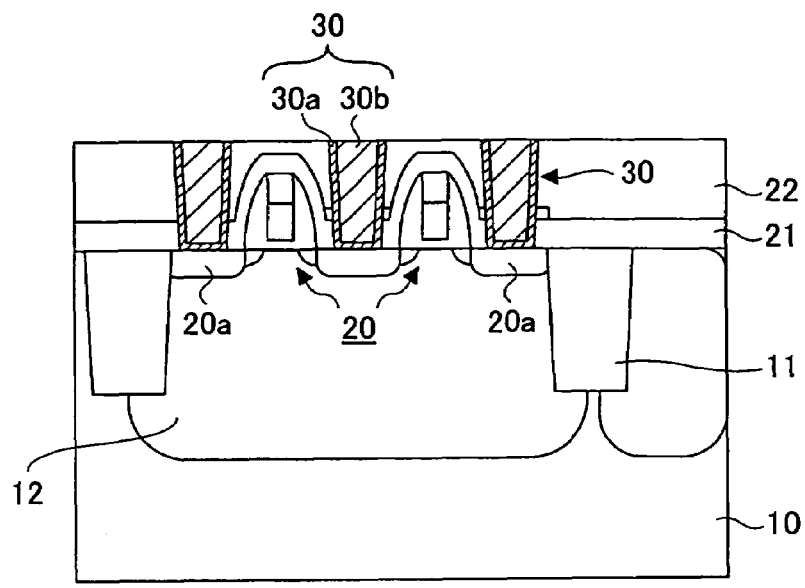
FIG. 4A through FIG. 4G illustrate a semiconductor device fabrication process according to the third embodiment of the invention.

To be more precise, as illustrated in FIG. 4A, MOS transistors 20 and tungsten (W) plugs 30 connected to the MOS transistors 20 are formed on the semiconductor substrate 10. The entire surface is planarized.

Figure 4B:
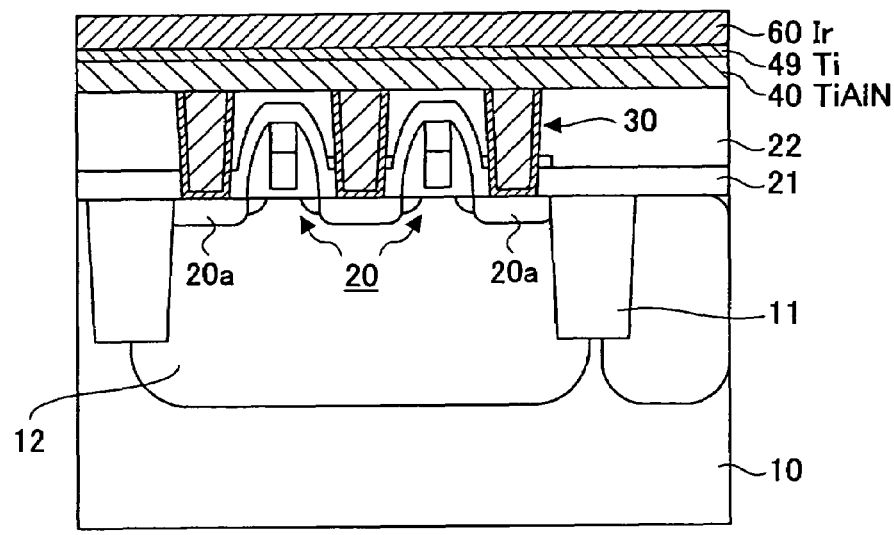

Then, as illustrated in FIG. 4B, a titanium aluminum nitride (TiAlN) film 40 with a thickness of 100 nm, which film serves as an oxygen barrier film, and a titanium seed film 49 with a thickness of 20 nm are formed over the interlevel dielectric layer 22. In addition, an iridium (Ir) film 60 with a thickness of 100 nm is formed as a lower electrode film over the Ti film 49 by sputtering at 500° C.

Figure 4C:
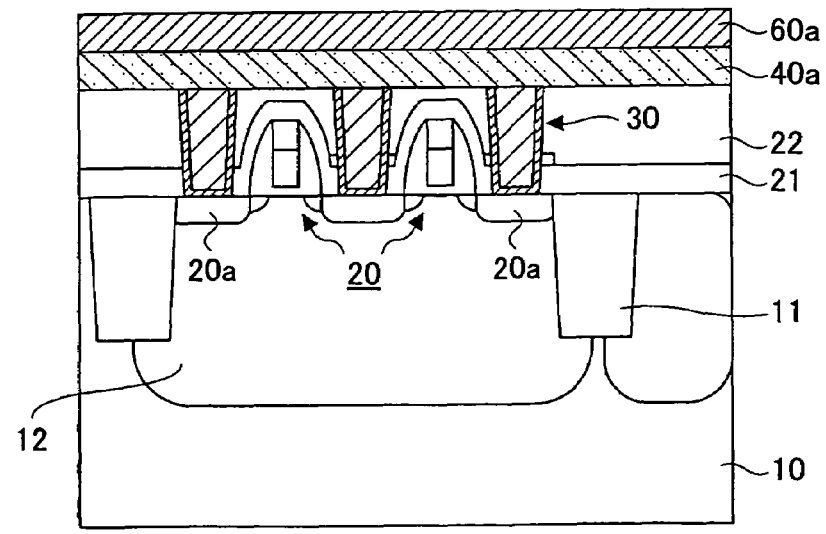

Then, as illustrated in FIG. 4C, rapid thermal annealing (RTA) is performed for 90 seconds at 650° C. in a nitrogen atmosphere under nitrogen (N2) supply of 10 l/min. Through the thermal process, the titanium (Ti) particles structuring the Ti seed film 49 diffuse into the Ir film 60 above and the TiAlN film 40 below. As a result, a composition-changed TiAlN film 40a and an Ir(Ti) film 60a containing diffused Ti particles remain over the interlevel dielectric layer 22.

Figure 4D:
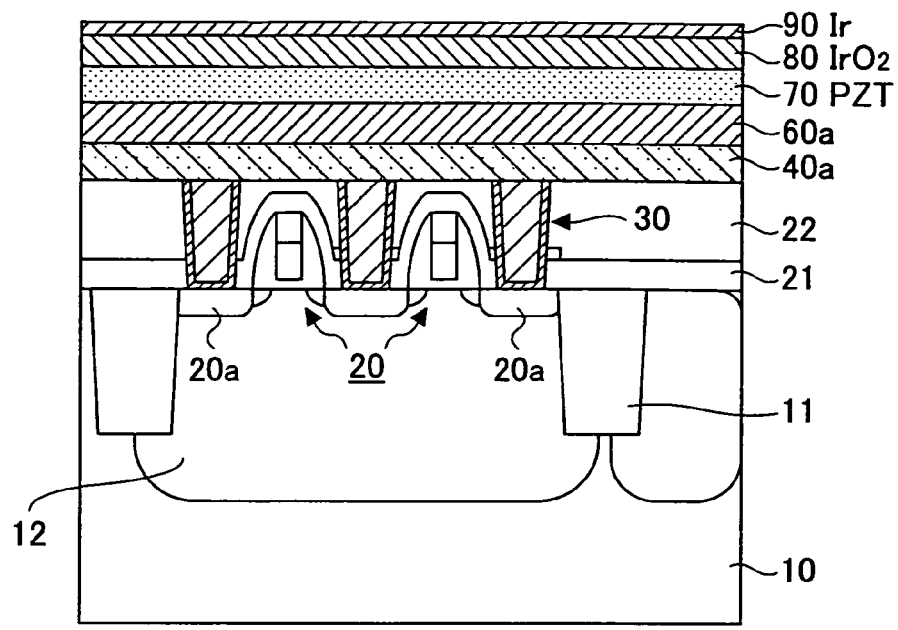

Then, as illustrated in FIG. 4D, a two-layered PZT ferroelectric film 70 is formed over the Ir(Ti) film 60a containing diffused Ti particles by an MOCVD method, and IrO$_2$ upper electrode film 80 with a thickness of 150 nm and Ir film 90 with a thickness of 50 nm are successively formed by sputtering over the PZT film 70.

Figure 4E:
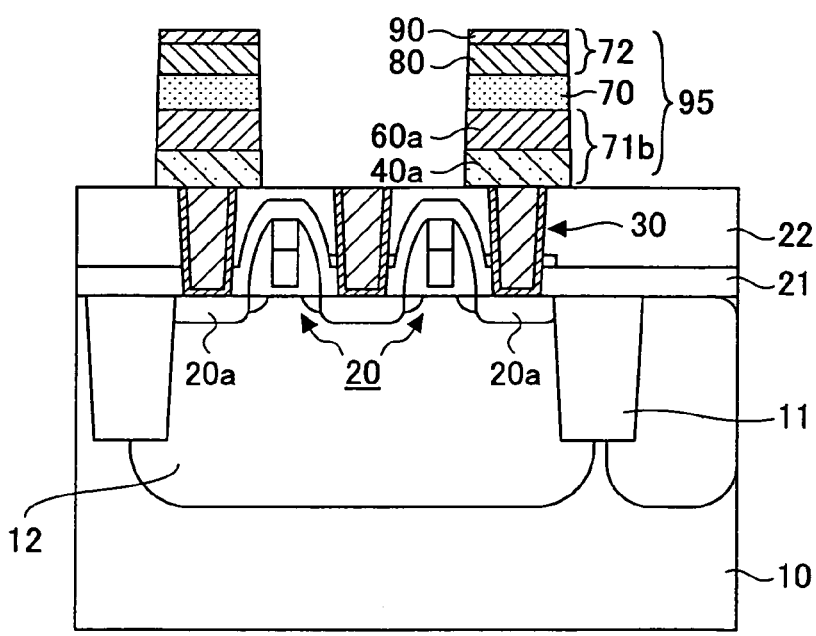

Then, as illustrated in FIG. 4E, the above-described films 40a, 60a, 70, 80, and 90 are patterned into a stacked ferroelectric capacitor 95 consisting of an upper electrode 72, a ferroelectric film 70, and a lower electrode 71b using known patterning and etching techniques. In this example, the lower electrode 71b includes a Ti particle contained Ir electrode film 60a and a TiAlN oxygen barrier film 40a. For the ferroelectric film 70 to recover from the damage suffered during the film formation of the upper electrode 72, recovery annealing is performed. Although, in this annealing, the side face of the capacitor 95 is exposed to the oxygen atmosphere, electric resistance of the device can be maintained low because no titanium (Ti) film is included in the layered structure. It should be noted that although the Ir(Ti) film 60a containing Ti particles may be slightly oxidized unlike a pure Ir film, increase of electric resistance can be prevented sufficiently as compared with the case in which a titanium (Ti) film exists in the layered structure.

Figure 4F:
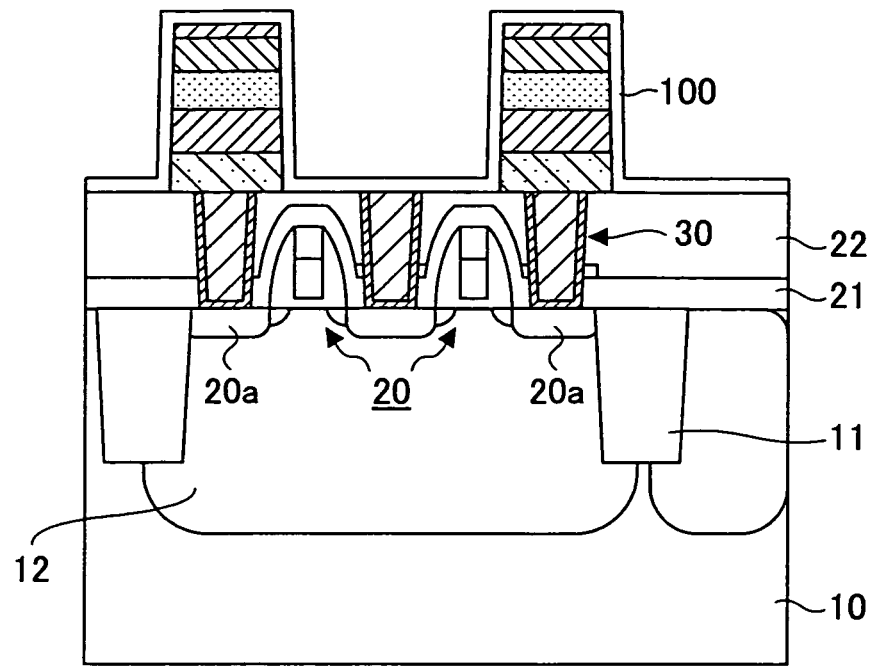

Then, as illustrated in FIG. 4F, the ferroelectric capacitor 95 and the first interlevel dielectric film 22 are covered with a protection film 100 with a thickness of 20 nm by an atomic layer deposition (ALD) method. In this example, the protection film 100 is an aluminum oxide film with excellent step coverage.

Figure 4G:
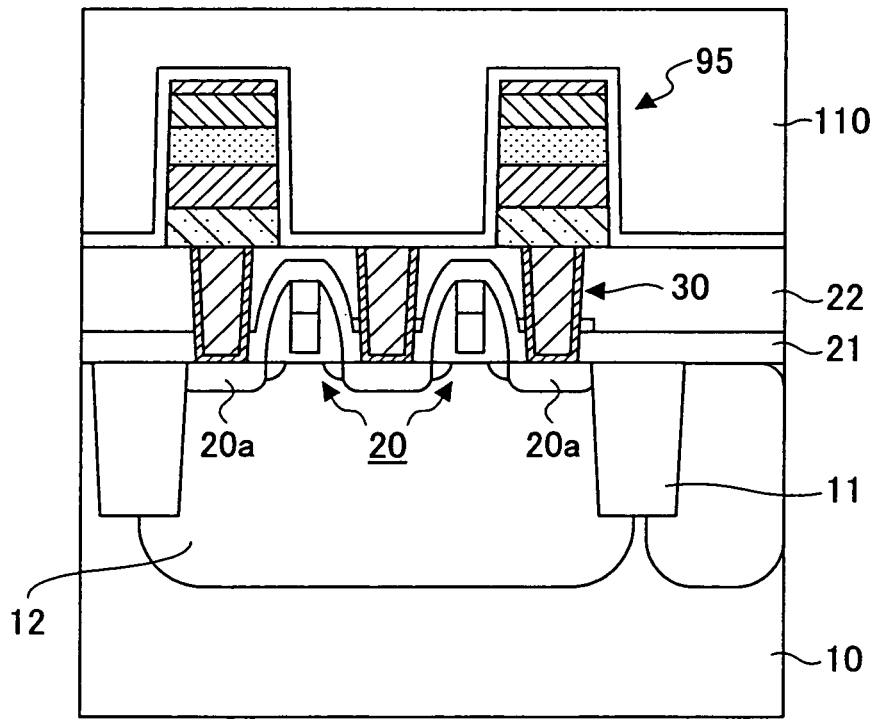

Then, as illustrated in FIG. 4G, a second interlevel dielectric film 110 is formed over the entire surface and flattened by CMP. Since the subsequent steps are the same as those shown in FIG. 2H and FIG. 2I, explanation for them is omitted.

Fourth Embodiment

FIG. 5A through FIG. 5F illustrate in cross-sectional views a semiconductor device fabrication process according to the fourth embodiment of the invention. The fourth embodiment is a combination of the second and third embodiments. A TiN film is formed by depositing a Ti film over the NH3 plasma processed surface and nitriding the Ti film. Over the TiN film are successively formed a TiAlN film, a Ti film, and an Ir film, and the Ti film is diffused and eliminated by a thermal process.

Figure 5A:
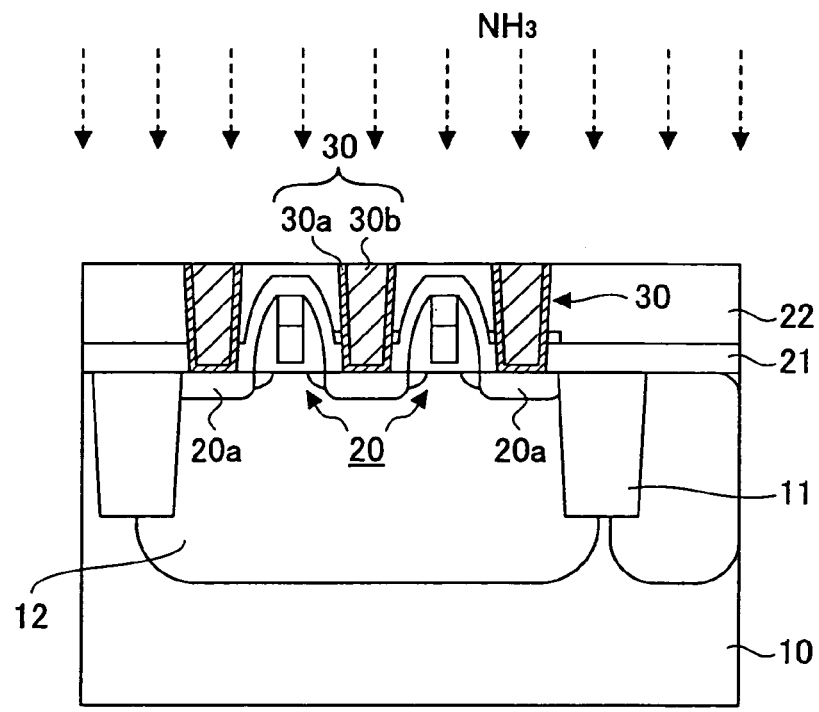
FIG. 5A through FIG. 5F illustrate a semiconductor device fabrication process according to the fourth embodiment of the invention.

To be more precise, as illustrated in FIG. 5A, MOS transistors 20 and tungsten (W) plugs 30 connected to the MOS transistors 20 are formed on the semiconductor substrate 10. After the entire surface of the wafer is planarized, the surface of the interlevel dielectric layer 22 in which the tungsten plugs 30 are formed is modified by plasma irradiation using NH3 gas.

Figure 5B:
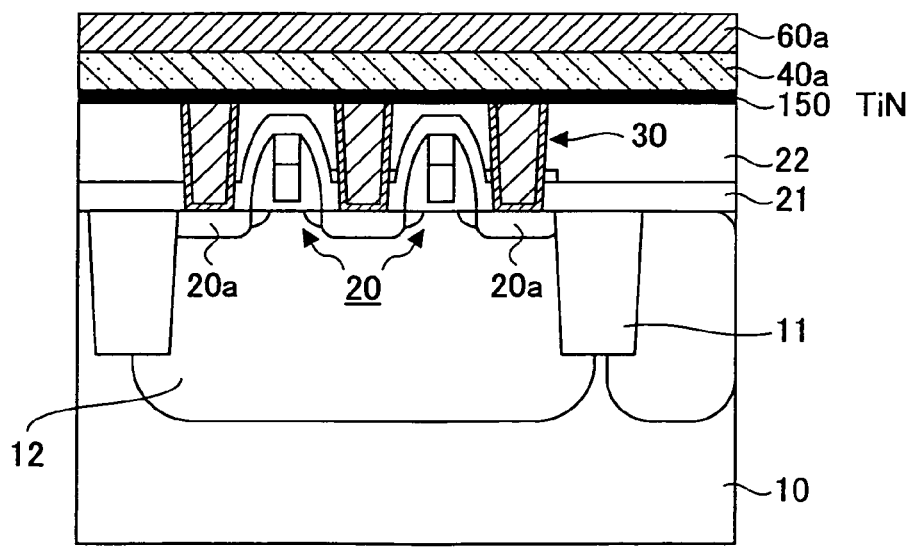

Then, as illustrated in FIG. 5B, a titanium (Ti) film (not shown) with a thickness of 20 nm is formed over the NH3 plasma processed surface. The Ti film is nitrided by performing RTA at 650° C. in the nitrogen (N2) atmosphere to form a titanium nitride (TiN) film 150. This TiN film 150 has crystal quality as goof as the originally deposited Ti film. Over the TiN film 150 are successively formed a TiAlN oxygen barrier film 40 (see FIG. 4B) with a thickness of 100 nm, a Ti seed film (see FIG. 4B) with a thickness of 5 nm, and an Ir lower electrode film 60 (see FIG. 4B) with a thickness of 100 nm. RTA is performed for 90 seconds at 650° C. in the nitrogen atmosphere under N2 supply of 10 l/min. By this thermal process, the Ti particles of the Ti film 49 diffuse into the Ir film 60 and the TiAlN film 40, and finally, only Ir(Ti) film 60a and composition-changed TiAlN film 40a containing Ti particles remain over the TiN film 150 without leaving the originally deposited Ti film.

Figure 5C:
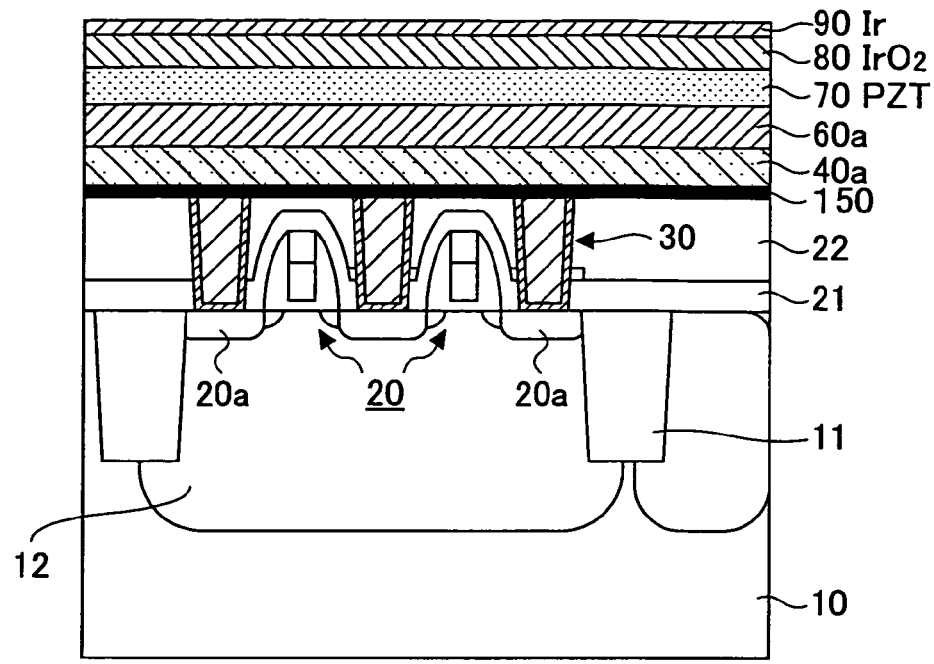

Then, as illustrated in FIG. 5C, a two-layered PZT ferroelectric film 70 is formed over the Ir(Ti) film 60a containing diffused Ti particles by an MOCVD method, and IrO$_2$ upper electrode film 80 with a thickness of 150 nm and Ir film 90 with a thickness of 50 nm are successively formed by sputtering over the PZT film 70.

Figure 5D:
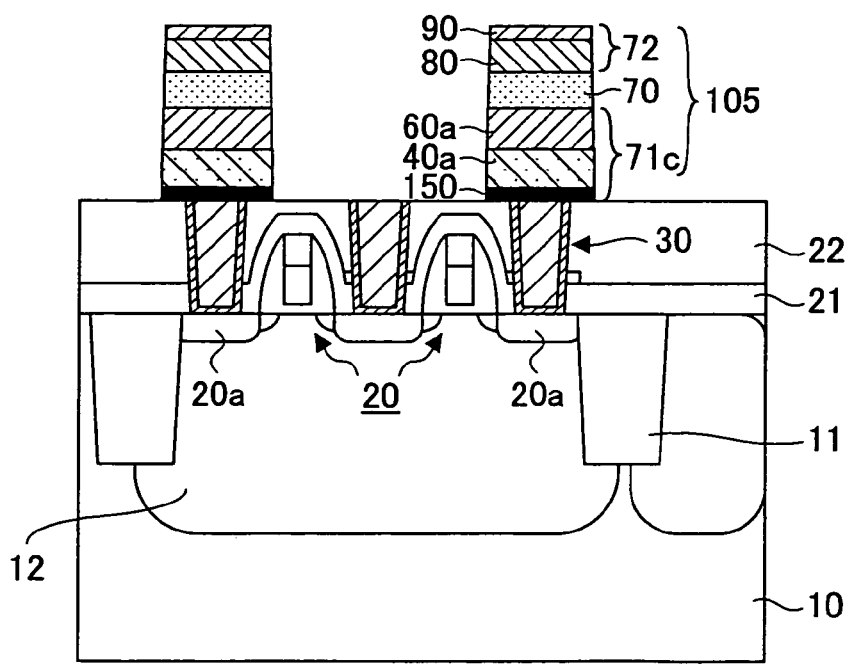

Then, as illustrated in FIG. 5D, the above-described films 150, 40a, 60a, 70, 80, and 90 are patterned into a stacked ferroelectric capacitor 105 consisting of an upper electrode 72, a ferroelectric film 70, and a lower electrode 71c using known patterning and etching techniques. In this example, the lower electrode 71c includes a Ti particle contained Ir electrode film 60a, a TiAlN oxygen barrier film 40a, and a TiN film 150 in direct contact with the tungsten (W) plug 30. For the ferroelectric film 70 to recover from the damage suffered during the film formation of the upper electrode 72, recovery annealing is performed. Although, in this annealing, the side face of the capacitor 105 is exposed to the oxygen atmosphere, electric resistance of the device can be maintained low because no titanium (Ti) film is included in the layered structure.

Figure 5E:
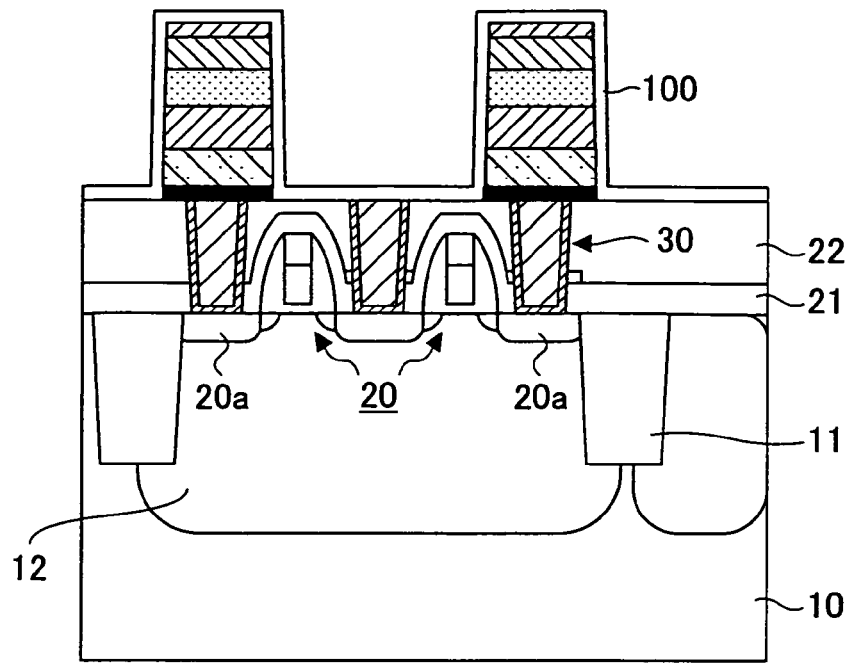

Then, as illustrated in FIG. 5E, the ferroelectric capacitor 105 and the first interlevel dielectric film 22 are covered with a protection film 100 with a thickness of 20 nm by an atomic layer deposition (ALD) method. In this example, the protection film 100 is an aluminum oxide film with excellent step coverage.

Figure 5F:
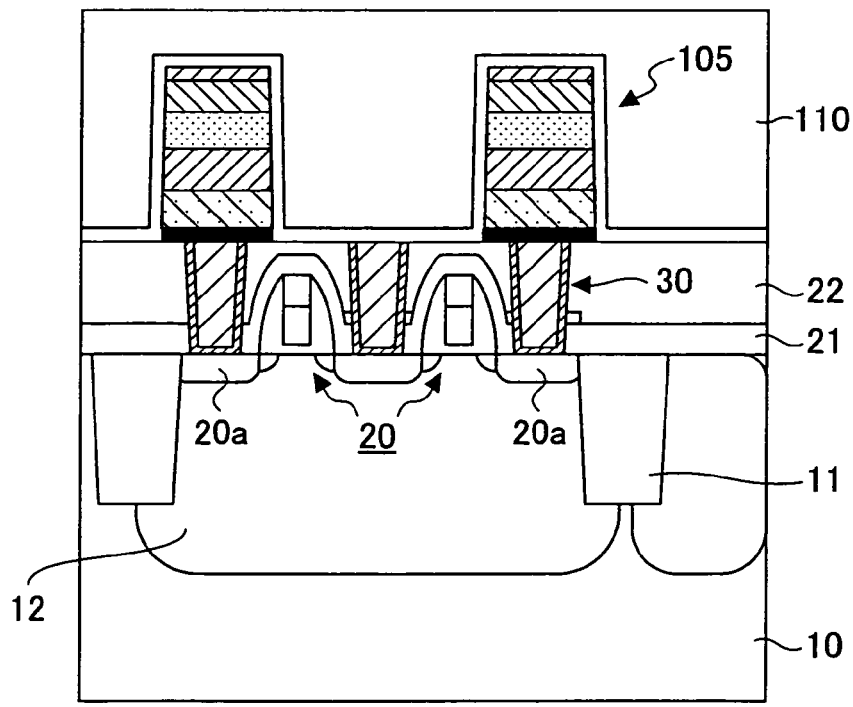

Then, as illustrated in FIG. 5F, a second interlevel dielectric film 110 is formed over the entire surface and flattened by CMP. Since the subsequent steps are the same as those shown in FIG. 2H and FIG. 2I, explanation for them is omitted.

Figure 6:
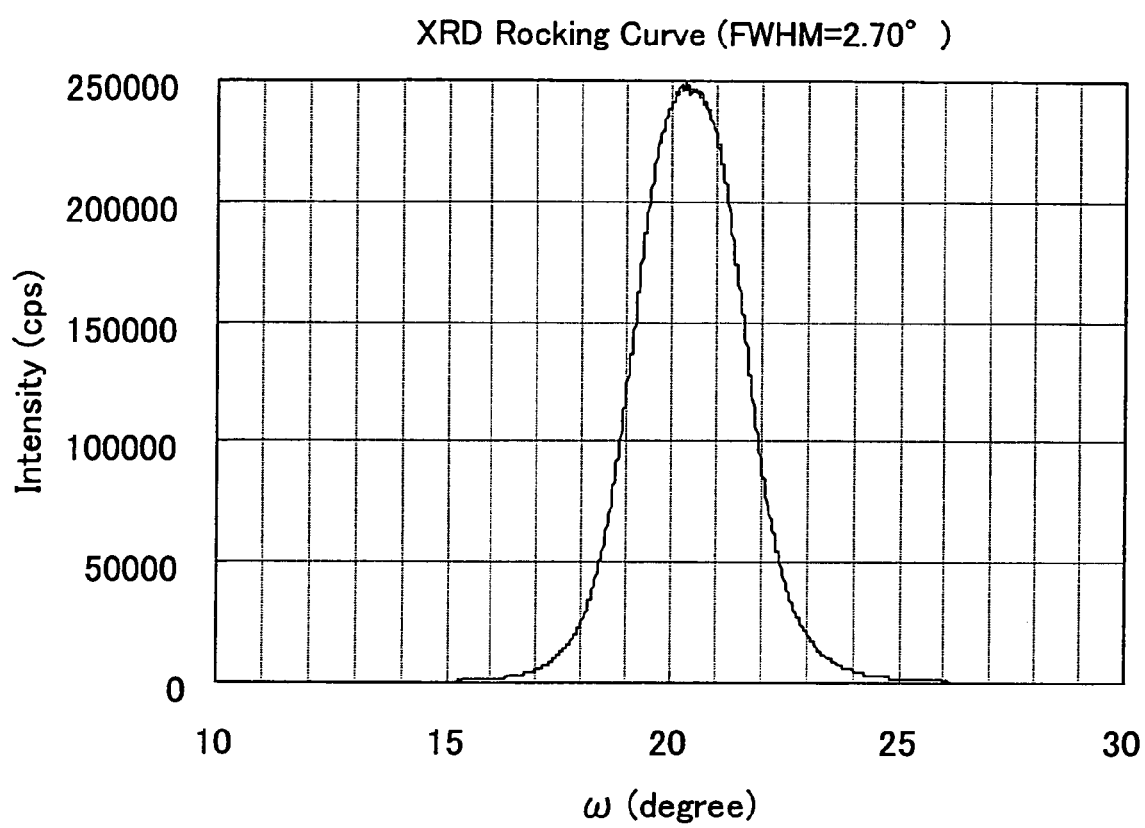
FIG. 6 is a graph showing an XRD rocking curve of the iridium film formed by the fabrication process of the second embodiment.

FIG. 6 is an X-ray diffraction (XRD) rocking curve of the iridium (Ir) film fabricated according to the second embodiment of the invention. In other words, the measured Ir film is arranged over a lower TiN film (second TiN film) obtained by nitriding a Ti film deposited over a NH3 plasma processed surface, a TiAlN film, and an upper TiN film. The measurement is made on the (111) surface of the Ir thin film.

In this measurement, the full width at half maximum (FWHM) of the Ir (111) rocking curve is 2.7°, which is much smaller than the conventional FWHM value of the Ir film. It is known that the FWHM value of an Ir film deposited directly over the TiAlN film is about 12°. From this measurement result, it is understood that the crystal orientation of the iridium (Ir) electrode film is greatly improved.

In conclusion, according to the embodiment, the crystal quality of the iridium (Ir) lower electrode film is improved even if a titanium aluminum nitride (TiAlN) film is used as an oxygen barrier film in a stacked FeRAM, and the crystal quality of the ferroelectric film (PZT film) placed directly over the Ir film is also improved. At the same time, increase of electric resistance due to oxidation of titanium (Ti) is effectively prevented. Consequently, a ferroelectric capacitor with a high switching capacitance Qsw and low resistance can be realized.

What is claimed is:

1. A semiconductor device fabrication method comprising the steps of:
    forming a conductive plug in an insulating layer on a semiconductor substrate so as to be connected to an element on the substrate;
    performing NH3 plasma irradiation on the insulating layer and a surface of the conductive plug after planarization;
    forming a titanium aluminum nitride (TiAlN) oxygen barrier film over the NH3 plasma irradiated conductive plug;
    forming a titanium (Ti) film over the oxygen barrier film;
    applying a thermal process to the titanium film in a nitrogen atmosphere to allow the titanium film to turn into a titanium nitride (TiN) film; and
    forming an iridium (Ir) containing lower electrode film of a capacitor over the titanium nitride film.

2. The method of claim 1, further comprising the steps of:
    forming a second titanium film over the NH3 plasma irradiated insulating layer and the conductive plug prior to the formation of the oxygen barrier film; and
    nitriding the second titanium film to obtain a second titanium nitride film.

3. The method of claim 1, wherein the thermal process is carried out at 650° C.

4. The method of claim 1, further comprising the steps of:
    forming a first ferroelectric film over the lower electrode;
    forming a second ferroelectric film over the first ferroelectric film; and
    forming an upper electrode over the second ferroelectric film.

5. The method of claim 4, wherein the first and second ferroelectric films include PZT films.

6. The method of claim 1, wherein first and second ferroelectric films are formed over the lower electrode by an MOCVD method.

7. The method of claim 6, wherein the first ferroelectric film is formed under a partial pressure of oxygen lower than that for forming the second ferroelectric film.

8. The method of claim 4, further comprising a step of:
    performing a thermal process in oxygen atmosphere after the formation of the upper electrode.

* * * * *